(12) United States Patent
Armstrong et al.

(10) Patent No.: US 11,011,387 B2
(45) Date of Patent: *May 18, 2021

(54) WET ETCHING OF SAMARIUM SELENIUM FOR PIEZOELECTRIC PROCESSING

(71) Applicant: INTERNATIONAL BUSINESS MACHINES CORPORATION, Armonk, NY (US)

(72) Inventors: Christine Armstrong, Stamford, NY (US); Matthew W. Copel, Yorktown Heights, NY (US); Yu Luo, Hopewell Junction, NY (US); Paul M. Solomon, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 70 days.

This patent is subject to a terminal disclaimer.

(21) Appl. No.: 16/366,651

(22) Filed: Mar. 27, 2019

(65) Prior Publication Data
US 2020/0227274 A1    Jul. 16, 2020

Related U.S. Application Data

(63) Continuation of application No. 15/405,546, filed on Jan. 13, 2017, now Pat. No. 10,332,753.

(51) Int. Cl.
*H01L 21/3213* (2006.01)
*H01L 41/332* (2013.01)
(Continued)

(52) U.S. Cl.
CPC .... *H01L 21/32134* (2013.01); *H01L 21/0256* (2013.01); *H01L 21/0262* (2013.01);
(Continued)

(58) Field of Classification Search
CPC ............ H01L 21/0256; H01L 21/0262; H01L 21/32134; H01L 41/16; H01L 41/187; H01L 41/316; H01L 41/332; H01L 41/39
(Continued)

(56) References Cited

U.S. PATENT DOCUMENTS

| 5,898,720 A | 4/1999 | Yamamoto et al. |
| 7,302,656 B2 | 12/2007 | Tang et al. |

(Continued)

OTHER PUBLICATIONS

List of IBM Patents or Patent Applications Treated as Related dated Mar. 27, 2019.

(Continued)

*Primary Examiner* — Lan Vinh
(74) *Attorney, Agent, or Firm* — Tutunjian & Bitetto, P.C.; Erik Johnson

(57) ABSTRACT

A subtractive forming method that includes providing a material stack including a samarium and selenium containing layer and an aluminum containing layer in direct contact with the samarium and selenium containing layer. The samarium component of the samarium and selenium containing layer of the exposed portion of the material stack is etched with an etch chemistry comprising citric acid and hydrogen peroxide that is selective to the aluminum containing layer. The hydrogen peroxide reacts with the aluminum containing layer to provide an oxide etch protectant surface on the aluminum containing layer, and the citric acid etches samarium selectively to the oxide etch protectant surface. Thereafter, a remaining selenium component of is removed by elevating a temperature of the selenium component.

18 Claims, 4 Drawing Sheets

(51) Int. Cl.
*H01L 41/39* (2013.01)
*H01L 41/16* (2006.01)
*H01L 41/187* (2006.01)
*H01L 41/316* (2013.01)
*H01L 21/02* (2006.01)

(52) U.S. Cl.
CPC ............ *H01L 41/16* (2013.01); *H01L 41/187* (2013.01); *H01L 41/316* (2013.01); *H01L 41/332* (2013.01); *H01L 41/39* (2013.01)

(58) Field of Classification Search
USPC ....... 438/163, 706, 710, 712, 714, 719, 723, 438/736, 745, 754, 763; 216/91, 102
See application file for complete search history.

(56) References Cited

U.S. PATENT DOCUMENTS

| | | | |
|---|---|---|---|
| 10,332,753 B2* | 6/2019 | Armstrong | ............ H01L 23/522 |
| 2003/0047752 A1 | 3/2003 | Campbell et al. | |
| 2011/0045659 A1 | 2/2011 | Hudait et al. | |
| 2014/0264155 A1 | 9/2014 | Van Duren et al. | |
| 2014/0273341 A1* | 9/2014 | Van Duren | ......... H01L 27/1225 438/104 |
| 2015/0001560 A1* | 1/2015 | Ryden | ................... H01L 27/153 257/88 |
| 2016/0276611 A1 | 9/2016 | Oooka et al. | |

OTHER PUBLICATIONS

U.S. Office Action issued in U.S. Appl. No. 15/804,394, dated Jun. 14, 2013, pp. 1-14.

Office Action with cited art in corresponding U.S. Appl. No. 16/272,331 dated Jan. 30, 2020 (pp. 1-24).

* cited by examiner

```
┌─────────────────────────────────────────────────────────────────┐
│ Providing a material stack including a samarium and selenium    │
│ containing layer and an aluminium containing layer in a direct  │
│ contact with the samarium and selenium containing layer         │
│                            1                                    │
└─────────────────────────────────────────────────────────────────┘
                              │
                              ▼
┌─────────────────────────────────────────────────────────────────┐
│       Masking the material stack to expose a portion            │
│              of the material stack to be etched                 │
│                            2                                    │
└─────────────────────────────────────────────────────────────────┘
                              │
                              ▼
┌─────────────────────────────────────────────────────────────────┐
│              Patterning the aluminum containing layer           │
│                            3                                    │
└─────────────────────────────────────────────────────────────────┘
                              │
                              ▼
┌─────────────────────────────────────────────────────────────────┐
│ Etching the samarium component of the samarium and selenium     │
│ containing layer of the exposed portion of the material stack   │
│ with and etch chemistry comprising citric acid and hydrogen     │
│ peroxide that is selective to the aluminum containing layer     │
│                            4                                    │
└─────────────────────────────────────────────────────────────────┘
                              │
                              ▼
┌─────────────────────────────────────────────────────────────────┐
│ Removing a remaining selenium component of the samarium and     │
│ selenium containing layer in the exposed portion of the         │
│ material stack by elevating a temperature of the selenium       │
│ component above a heat of vaporization for the selenium         │
│ component                                                       │
│                            5                                    │
└─────────────────────────────────────────────────────────────────┘
```

FIG. 1

WET ETCHING OF SAMARIUM SELENIUM FOR PIEZOELECTRIC PROCESSING

STATEMENT REGARDING FEDERALLY SPONSORED RESEARCH OR DEVELOPMENT

This invention was made with Government support under Contract No. H98230-13-0122 awarded by Defense Advanced Research Projects Agency (DARPA). The Government has certain rights in this invention.

BACKGROUND

Technical Field

The present disclosure relates generally to microelectronic fabrication, and more particularly to methods of etching samarium and selenium containing layers without removing aluminum containing layers.

Description of the Related Art

With the continuing trend towards miniaturization of integrated circuits (ICs), there is a need for transistors to have higher drive currents with increasingly smaller dimensions. Part of processing advancements to provide smaller dimensions in microelectronic devices include advancements in etches processing.

SUMMARY

In one embodiment, a subtractive forming method is described herein that includes providing a material stack including a samarium and selenium containing layer and an aluminum containing layer in direct contact with the samarium and selenium containing layer; and masking the material stack to expose a portion of the material stack to be etched. The method may continue with patterning the aluminum containing layer; and etching the samarium component of the samarium and selenium containing layer of the exposed portion of the material stack with an etch chemistry comprising citric acid and hydrogen peroxide that is selective to the aluminum containing layer. In some embodiments, the hydrogen peroxide reacts with the aluminum containing layer to provide an oxide etch protectant surface on the aluminum containing layer, and the citric acid etches samarium selectively to the oxide etch protectant surface. In some embodiment, the method may continue with removing a remaining selenium component of the samarium and selenium containing layer in the exposed portion of the material stack by elevating a temperature of the selenium component above a heat of vaporization for the selenium component.

In another embodiment, a subtractive forming method is described herein for forming piezoresistive material stacks. The method may include forming a mask on a first portion of the piezoresistive material stack, wherein a second portion of the piezoresistive material stack is exposed; and applying an etch chemistry to the exposed portion of piezoresistive material stack. The etch chemistry may include a hydrogen peroxide component for forming a surface oxide on a metal component of the piezoresistive material stack and a citric acid component for removing a first element of a piezoelectric layer of the piezoresistive material stack selectively to the surface oxide, wherein at least one second element of the piezoelectric layer remains. The method may further include heating the piezoelectric material stack after applying the etch chemistry. The heating is conducted to vaporize the at least one second element of the piezoelectric layer that remains in said exposed portion of said material stack, the first portion of the material stack being protected from being removed by said etch chemistry and said heating by said mask.

In yet another embodiment, a method of forming a device including a piezoelectric material layer is described herein. The method can include providing a material stack including a dielectric layer separating a first portion of a lower electrode from a first portion of a samarium and selenium containing piezoelectric layer. A second portion of the lower electrode is in contact with a first portion of the samarium and selenium containing piezoelectric layer. The material stack further includes an upper electrode layer in direct contact with a surface the samarium and selenium piezoelectric layer that are opposite the surface of the samarium and selenium piezoelectric layer that is in contact with the dielectric layer. The method may further include masking the material stack to expose a portion of the material stack to be etched, patterning the upper electrode layer; and etching the samarium component of the samarium and selenium containing layer of the exposed portion of the material stack with an etch chemistry comprising citric acid and hydrogen peroxide that is selective to the upper electrode layer. In some embodiments, the hydrogen peroxide reacts with the upper electrode layer to provide an etch protectant surface on the upper electrode layer, and the citric acid etches samarium selectively to the etch protectant surface leaving a residue of selenium on the dielectric layer. In a following process step, the selenium residue is removed by elevating a temperature of the selenium component above a heat of vaporization for the selenium component.

BRIEF DESCRIPTION OF DRAWINGS

The disclosure will provide details in the following description of preferred embodiments with reference to the following figures wherein:

FIG. 1 is a flow chart illustrating one embodiment of a subtractive forming method that includes an etch step for etching samarium and selenium containing layers without removing aluminum containing layers, in accordance with one embodiment of the present disclosure.

DETAILED DESCRIPTION OF PREFERRED EMBODIMENTS

Figure 2:
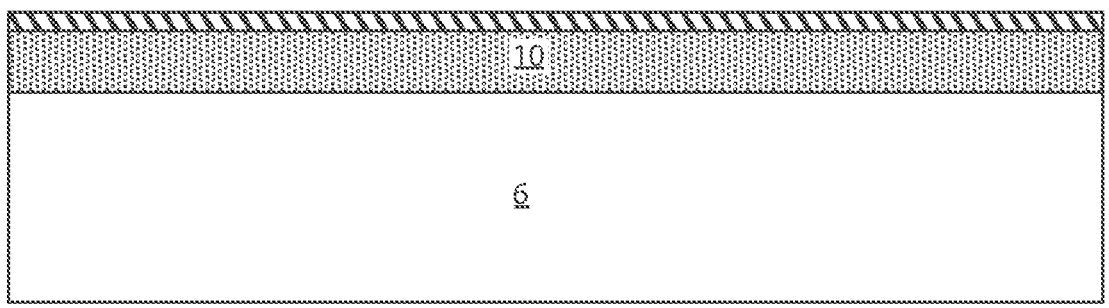
FIG. 2 is a side cross-sectional view illustrating one embodiment of a partial material stack for forming a device including a piezoelectric material layer composed of a samarium and selenium containing layer, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein provide a selective etch process suitable for microelectronics fabrication, and more particularly to selectively etching samarium and selenium containing layers without removing aluminum containing layers. Thick film piezoelectric materials have been in industrial use for many years, but thin film piezoelectrics are relatively new. A piezoelectric (PE) material either expands or contracts, depending on the polarity of the voltage applied across it. A piezoresistive (PR) material is pressure sensitive, in that it may have a high or low resistance depending on its compression. One material of particular interest as a piezo resistive material is Samarium Selenium (SmSe). It has been determined that one inherent difficulty in working with samarium selenium (SmSe) is etching the material selectively to aluminum containing contacts. Further details of the methods of the present disclosure are now discussed with greater detail with reference to FIGS. 1-5.

FIG. 1 is a flow chart illustrating one embodiment of a subtractive forming method that includes an etch step for etching samarium and selenium containing layers without removing aluminum containing layers. Beginning at step 1, the method may include providing a material stack including a samarium and selenium containing layer 20 and an aluminum containing layer 25 in direct contact with the samarium and selenium containing layer 20.

FIG. 2 depicts one embodiment of a partial material stack for forming a device including a piezoelectric material layer composed of a samarium and selenium containing layer 20. The partial material stack that is depicted in FIG. 2 includes a supporting substrate 6; an electrically conductive material layer 10 to provide an electrode that is present on the supporting substrate 6, and a dielectric layer 15 that is present atop the electrically conductive material layer 10 that provides the electrode.

The supporting substrate 6 may be a bulk-semiconductor substrate. In one example, the bulk-semiconductor substrate may be a silicon-containing material. Illustrative examples of Si-containing materials suitable for the bulk-semiconductor substrate that provides the supporting substrate 6 include, but are not limited to, Si, SiGe, SiGeC, SiC, polysilicon, i.e., polySi, epitaxial silicon, i.e., epi-Si, amorphous Si, i.e., α:Si, and multi-layers thereof. Alternative semiconductor materials can also be employed for the supporting substrate 6, such as, but not limited to, germanium, gallium arsenide, gallium nitride, silicon germanium, cadmium telluride and zinc sellenide, as well as other type IV and III-V semiconductors. Although not depicted in FIG. 2, the supporting substrate 6 may also be a semiconductor on insulator (SOI) substrate or an extremely thin semiconductor on insulator (ETSOI) substrate. The electrically conductive material layer 10 is formed atop the supporting substrate 6. "Electrically conductive" as used through the present disclosure means a material typically having a room temperature conductivity of greater than $10^{-8}$ $(\Omega\text{-m})^{-1}$. The electrically conductive material layer 10 may be composed of a metal or metal nitride. In some embodiments, the electrically conductive material layer 10 is a metal selected from aluminum, copper, tungsten, tantalum, titanium, platinum, tungsten, ruthenium, rhenium, gold, silver, rhodium, molybdenum and combinations thereof.

In some other embodiments, the electrically conductive material layer 10 is comprised of titanium nitride, tantalum nitride, tungsten nitride and combinations thereof. The electrically conductive material layer 10 may be formed using a physical vapor deposition (PVD) process, plating, electroplating, and/or electroless plating. In other embodiments, the electrically conductive material layer 10 may be formed using chemical vapor deposition (CVD) or atomic layer deposition (ALD). The electrically conductive material layer 10 may provide at least one electrode for providing electrical communication to the device.

The dielectric layer 15 may be formed top the electrically conductive material layer 10 may be any dielectric layer, such as an oxide, e.g., silicon oxide, nitride, e.g., silicon nitride, or oxynitride, e.g., silicon oxynitride. Alternatively, high-k dielectrics, such as oxides of Ta, Zr, Al, Hf (e.g., hafnium oxide) or combinations thereof may be used for the dielectric layer 15. In another embodiment, the dielectric layer 15 is composed of $ZrO_2$, $Ta_2O_5$ or $Al_2O_3$. In one embodiment, the dielectric layer 15 has a thickness ranging from 1 nm to 10 nm. The dielectric layer 15 may be formed using chemical vapor deposition (CVD), such as plasma enhanced chemical vapor deposition (PECVD).

Figure 3:
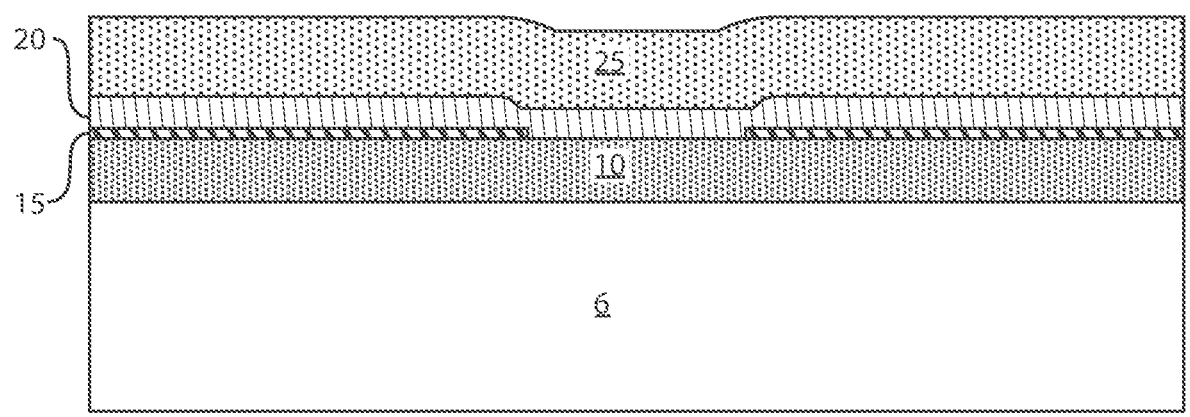
FIG. 3 is a side cross-sectional view depicting patterning a dielectric layer of the partial material stack for forming the device including the piezoelectric material layer to expose a portion of an electrically conductive material layer that provides an electrode of the device, and forming a stack of a piezoelectric material layer of samarium and selenium and an aluminum containing layer, in accordance with one embodiment of the present disclosure.

FIG. 3 depicts patterning a dielectric layer 15 of the partial material stack for forming the device including the piezoelectric material layer 20 to expose a portion of an electrically conductive material layer 10 that provides an electrode of the device, and forming a stack of a piezoelectric material layer 20 of samarium and selenium and an aluminum containing layer 25. The dielectric layer 15 may be patterned using deposition, photolithography and etch processes. For example, a pattern is produced by applying a photoresist to the surface to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions, i.e., unprotected portion of the dielectric layer 15. The exposed portion, i.e., unprotected portion, of the dielectric layer 15 may then be etched using a selective etch process. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. In one example, the exposed portion, i.e., unprotected portion, of the dielectric layer 15 is removed selectively to the underlying electrically conductive material layer 10. The exposed portion, i.e., unprotected portion, of the dielectric layer 15 gate structure 30 may be removed using a wet or dry etch process. In one embodiment, the exposed portion, i.e., unprotected portion, of the dielectric layer 15 is removed by reactive ion etch (RIE). The portion of the dielectric layer 15 removed to expose the underlying electrically conductive material layer 10 may be referred to as a window.

The piezoelectric material layer 20 of samarium and selenium may be deposited overlying the remaining portion of the dielectric layer 15 and in direct contact with the electrically conductive material layer 10 through the window that is formed in the dielectric layer 15. The piezoelectric material layer 20 may be formed using chemical vapor deposition (CVD), physical vapor deposition (PVD), and/or atomic layer deposition (ALD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. PVD deposition methods may include plating, electroless plating, electroplating, sputtering and combinations thereof.

The piezoelectric material layer 20 of samarium and selenium may be a samarium and selenium containing layer comprises 10 at. % to 90 at. % samarium (Sm) and 90 at. % to 10 at. % selenium (Se). In some embodiments, the piezoelectric material layer 20 of samarium and selenium may be samarium selenium (SmSe). The samarium selenium (SmSe) layer may comprise 10 at. % to 90 at. % samarium (Sm) and 90 at. % to 10 at. % selenium (Se), and can be free of other elements with the exception of impurities. For example, a suitable impurity level may be 1 at. % or less. In another example, the impurity level may be 0.5 at. % or less. In yet another example, the impurity level may be 0.1 wt. % or less. In yet another example, the piezoelectric material layer 20 of samarium and selenium may be 100 at. % samarium selenium (SmSe). In some other embodiments, the piezoelectric material layer 20 of samarium and selenium may be alloyed with aluminum (Al), chromium (Cr), titanium (Ti), and silicon (Si), and combinations thereof.

The aluminum containing layer 25 is formed directly on the piezoelectric material layer 20 of samarium and selenium. The aluminum containing layer 25 may be deposited using chemical vapor deposition (CVD), atomic layer deposition (ALD), physical vapor deposition (PVD) or a combination thereof. For example, the aluminum containing layer 25 may be deposited using plating, such as electroplating or electroless plating, as well as sputtering. Plating is a method of depositing a layer of metal on a deposition surface. Electroplating is a process that uses electrical current to control the flow of charged particles, such as metal cations and anions, so that they form a coherent metal coating the deposition surface. Sputtering is another example of a PVD process that can form the aluminum containing layer 25.

In one embodiment, the aluminum including material for the aluminum containing layer 25 is a pure aluminum, i.e., 100 at. % aluminum. The pure aluminum may include incidental oxidation of the aluminum. In another embodiment, the aluminum including material is a mixture of aluminum and one or more other metals. An aluminum-metal mixture can be a heterogeneous mixture, or alternatively, a homogeneous mixture, such as an alloy. Generally, the alloys considered herein contain aluminum in an amount of at least 40% by weight of the alloy, and more generally, at least 50%, 60%, 70%, 80%, 90%, 95%, 97%, 98%, or 99% by weight of the alloy. In some embodiments, the aluminum containing layer 25 may be alloyed with chromium (Cr), titanium (Ti), and silicon (Si), and combinations thereof.

It is noted that any composition including aluminum may be employed for the aluminum including layer 25, so long as the composition is electrically conductive.

Figure 4:
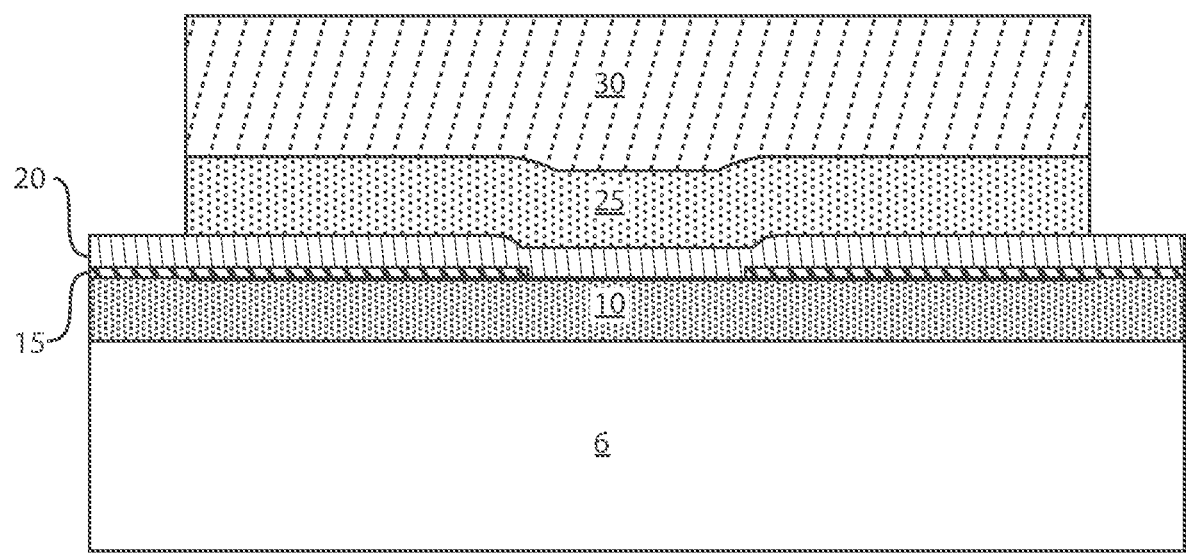
FIG. 4 is a side cross-sectional view depicting patterning the aluminum containing layer, in accordance with one embodiment of the present disclosure.

FIG. 4 depicts one embodiment of patterning the aluminum containing layer 25. Referring to Step 2 of FIG. 1, patterning the aluminum containing layer 25 may begin with forming a photoresist mask 30, as depicted in FIG. 4. For example, a photoresist mask 30 can be produced by applying a photoresist to the surface to be etched; exposing the photoresist to a pattern of radiation; and then developing the pattern into the photoresist utilizing a resist developer to provide the photoresist mask 30, wherein the sections of the aluminum containing layer 25 covered by the photoresist mask 30 are protected, while the exposed regions are removed in a following etch process.

Referring to step 3 of the process flow illustrated in FIG. 1, in a following process step, the aluminum containing layer 25 may be patterned, i.e., etched, as depicted in FIG. 4. The etch process for removing the exposed portions of the aluminum containing layer 25 can be selective to at least one of the photoresist mask and the underlying piezoelectric material layer 20 of samarium and selenium. The etch process may be a dry etch process or a wet chemical etch process. The etch process may be anisotropic. Examples of anisotropic etch processes that are suitable for this stage of the present disclosure include reactive ion etch (RIE), laser etching, laser milling, gas plasma etching and combinations thereof.

Step 4 of the process flow illustrated in FIG. 1 can include etching the samarium component of the samarium and selenium containing layer 20 of the exposed portion of the material stack with an etch chemistry comprising citric acid and hydrogen peroxide that is selective to the aluminum containing layer 25.

Figure 5:
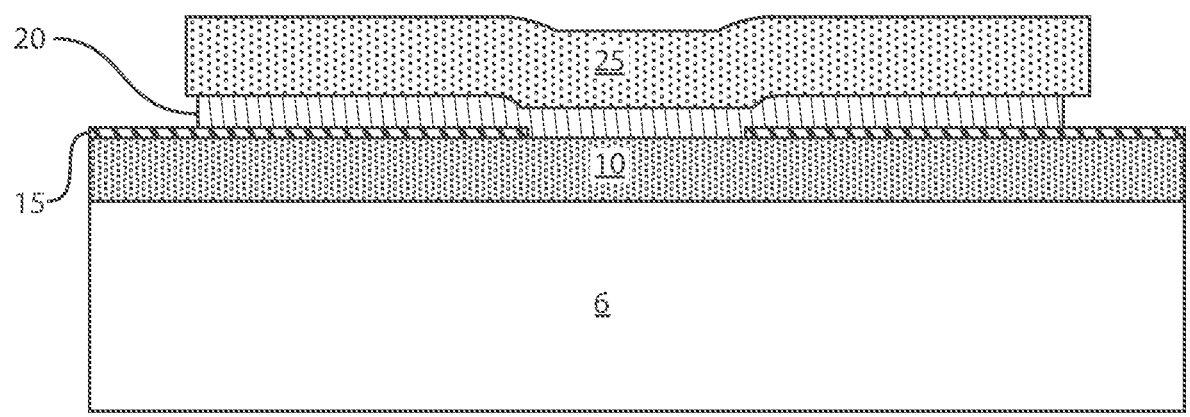
FIG. 5 is a side cross-sectional view depicting etching the samarium component of the samarium and selenium containing layer of the exposed portion of the material stack with an etch chemistry comprising citric acid and hydrogen peroxide that is selective to the aluminum containing layer followed by a high temperature process, in accordance with one embodiment of the present disclosure.

FIG. 5 depicts one embodiment of etching the samarium component of the samarium and selenium containing layer of the exposed portion of the material stack with an etch chemistry comprising citric acid and hydrogen peroxide that is selective to the aluminum containing layer followed by a high temperature process.

In some embodiments, during etching the samarium component of the samarium and selenium containing layer 20 with the etch chemistry of citric acid and hydrogen peroxide that is selective to the aluminum containing layer, the hydrogen peroxide reacts with the aluminum containing layer to provide an oxide etch protectant surface on the aluminum containing layer. For example, the oxide etch protectant surface may be composed of aluminum oxide ($Al_2O_3$).

In some embodiments, during etching the samarium component of the samarium and selenium containing layer 20 with the etch chemistry of citric acid and hydrogen peroxide that is selective to the aluminum containing layer, the citric acid etches samarium selectively to the oxide etch protectant surface that is present on the aluminum containing layer.

The etch chemistry is typically a wet etch. In some embodiments, the etch chemistry comprises hydrogen peroxide in an aqueous solution in an amount ranging from 1 wt/wt % to 20 wt/wt %, with citric acid present in the aqueous solution in an amount ranging from 1 wt/wt % to 20 wt/wt %. It is noted that the aforementioned composition is only one example of a etch composition for removing the samarium component of the samarium and selenium containing layer that provides the piezoelectric material layer 20.

In some examples, the aqueous etch solution that is suitable for etching the samarium component may include citric acid in combination with hydrogen peroxide, in which the portion of citric acid is equal to 1 wt/wt %, 2 wt/wt %, 4 wt/wt. %, 6 wt/wt %, 8 wt/wt %, 10 wt/wt %, 12 wt/wt %, 14 wt/wt. %, 16 wt/wt %, 18 wt/wt %, 20 wt/wt % and 25 wt/wt %, or any range including one of the aforementioned values as the lower endpoint of the range, and one of the aforementioned values as the upper endpoint of the range. In some examples, the aqueous etch solution that is suitable for etching the samarium component may include citric acid in combination with hydrogen peroxide, in which the portion of hydrogen peroxide is equal to 1 wt/wt %, 2 wt/wt %, 4 wt/wt. %, 6 wt/wt %, 8 wt/wt %, 10 wt/wt %, 12 wt/wt %, 14 wt/wt. %, 16 wt/wt %, 18 wt/wt %, 20 wt/wt % and 25 wt/wt %, or any range including one of the aforementioned values as the lower endpoint of the range, and one of the aforementioned values as the upper endpoint of the range.

In some embodiments, the etching of the samarium component of the samarium and selenium containing layer of the exposed portion of the material stack with the etch chemistry comprising citric acid and hydrogen peroxide comprises applying the etch chemistry to the material stack at room temperature, e.g., 20° C. to 25° C. In some other embodiments, the temperature of the etch process may be slightly elevated from room temperature.

In some embodiments, the etching of the samarium component of the samarium and selenium containing layer 20 of the exposed portion of the material stack with the etch chemistry comprising citric acid and hydrogen peroxide includes a time period ranging from 5 seconds to 10 minutes. In another embodiment, the time period for this etch stage may range from 15 seconds to 5 minutes. In other examples, the time period for the application of the citric acid and hydrogen peroxide wet etch is equal to 15 seconds, 30 seconds, 45 seconds 1 minute, 2 minutes, 3 minutes, 4 minutes and 5 minutes, as well as any range of time including a lower limit selected from the aforementioned examples, and an upper limit selected from the aforementioned examples.

The method may continue at step 5 of the process flow illustrated in FIG. 1 with removing a remaining selenium component of the samarium and selenium containing layer 20 by elevating a temperature of the selenium component above a heat of vaporization for the selenium component. The remaining selenium component is vaporized by the increased heat. The remaining component of the piezoelectric layer 20 that is vaporized by heating may include selenium (Se), sulfur (S), and tellurium (Te) and combinations thereof. Elevating the temperature of the etched surface typically occurs after the wet etchant for removing the samarium component of the samarium and selenium containing layer 20 has been removed.

In some embodiments, removing the remaining selenium component of the samarium and selenium containing layer 20 includes heating in a furnace at a temperature greater than 100° C. for a time period greater than 1 minute, e.g., 5 minutes or greater. In some embodiments, the temperature for vaporizing the remaining selenium component of the samarium and selenium containing layer 20 may range from 100° C. to 600° C. In some examples, the temperature for removing the remaining selenium component of the etched samarium and selenium containing layer 20 may be equal to 150° C., 200° C., 250° C., 300° C., 350° C., 400° C., 450° C., 500° C., 550° C. and 600° C., as well as any range of temperatures including a lower limit provided by one of the aforementioned examples and an upper limit provided by one of the aforementioned examples. In some examples, the time period for the removing the remaining selenium component of the samarium and selenium containing layer 20 may be equal to 1 minute, 5 minutes, 10 minutes, 15 minutes, 20 minutes, 25 minutes, 30 minutes, 35 minutes, 40 minutes, 45 minutes, 50 minutes, 55 minutes and 60 minutes, as well as any range of time including a lower limit provided by one of the aforementioned examples and an upper limit provided by one of the aforementioned examples. The temperature for vaporizing the remaining selenium component of the samarium and selenium containing layer 20 may be raised by furnace anneal, rapid thermal anneal (RTA), laser anneal, electromagnetic annealing, forced air heat, and combinations thereof. In some embodiments, heating the material stack comprises a nitrogen containing atmosphere.

Methods as described herein may be used in the fabrication of piezoelectric devices that can be used with integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A subtractive forming method comprising:
   for a material stack including a samarium and selenium containing layer and an aluminum containing layer in direct contact with the samarium and selenium containing layer:
   etching the samarium component of the samarium and selenium containing layer of the exposed portion of the material stack with an etch chemistry comprising citric acid and hydrogen peroxide that is selective to the aluminum containing layer; and
   removing a remaining selenium component of the samarium and selenium containing layer in the exposed portion of the material stack by elevating a temperature of the selenium component above a heat of vaporization for the selenium component.

2. The method of claim 1, wherein the samarium and selenium containing layer comprises 10 at. % to 90 at. % samarium (Sm), and 90 at. % to 10 at. % selenium (Se).

3. The method of claim 1, wherein the aluminum containing layer comprises greater than 95 at. % aluminum (Al).

4. The method of claim 1, further comprising masking the material stack to expose a portion of the material stack to be etched, masking including forming a photoresist mask.

5. The method of claim 1, wherein the etch chemistry comprises hydrogen peroxide in an aqueous solution in an amount ranging from 1 wt/wt % to 20 wt/wt %, with citric acid present in the aqueous solution in an amount ranging from 1 wt/wt % to 20 wt/wt %.

6. The method of claim 1, wherein etching the samarium component of the samarium and selenium containing layer of the exposed portion of the material stack with the etch chemistry comprising citric acid and hydrogen peroxide comprises applying the etch chemistry to the material stack at room temperature.

7. The method of claim 1, wherein said etching the samarium component of the samarium and selenium containing layer of the exposed portion of the material stack with an etch chemistry comprising citric acid and hydrogen peroxide comprises a time period ranging from 15 seconds to 5 minutes.

8. The method of claim 1, wherein said removing the remaining selenium component of the samarium and selenium containing layer in the exposed portion of the material stack by elevating the temperature of the selenium component comprises heating the material stack following said etching in a furnace at a temperature greater than 100° C. for a time period greater than 5 minutes.

9. The method of claim 8, wherein said heating the material stack comprises a nitrogen containing atmosphere.

10. A subtractive forming method comprising:
    etching a samarium component of a samarium and selenium containing layer of a material stack with an etch chemistry that is selective to an aluminum containing layer in direct contact with the samarium and selenium containing layer; and
    removing a remaining selenium component of the samarium and selenium containing layer of the material stack by elevating a temperature of the selenium component above a heat of vaporization for the selenium component.

11. The method of claim 10, wherein the samarium and selenium containing layer comprises 10 at. % to 90 at. % samarium (Sm), and 90 at. % to 10 at. % selenium (Se).

12. The method of claim 10, wherein the aluminum containing layer comprises greater than 95 at. % aluminum (Al).

13. The method of claim 10, further comprising masking the material stack to expose a portion of the material stack to be etched, masking including forming a photoresist mask.

14. The method of claim 10, wherein the etch chemistry comprises hydrogen peroxide in an aqueous solution in an amount ranging from 1 wt/wt % to 20 wt/wt %, with citric acid present in the aqueous solution in an amount ranging from 1 wt/wt % to 20 wt/wt %.

15. The method of claim 10, wherein the etch chemistry includes citric acid and hydrogen peroxide; and
    wherein etching the samarium component of the samarium and selenium containing layer of the material stack comprises applying the etch chemistry to the material stack at room temperature.

16. The method of claim 10, wherein the etch chemistry includes citric acid and hydrogen peroxide; and
    wherein etching the samarium component of the samarium and selenium containing layer of the material stack comprises applying the etch chemistry for a time period ranging from 15 seconds to 5 minutes.

17. The method of claim 10, wherein said removing the remaining selenium component of the samarium and selenium containing layer of the material stack by elevating the temperature of the selenium component comprises heating the material stack following said etching in a furnace at a temperature greater than 100° C. for a time period greater than 5 minutes.

18. The method of claim 17, wherein said heating the material stack comprises a nitrogen containing atmosphere.

* * * * *